United States Patent
Zhao (10) Patent No.: US 9,205,466 B2
(45) Date of Patent: Dec. 8, 2015

(54) FLOW TANK

(75) Inventor: Liang Zhao, Singapore (SG)

(73) Assignee: JCS-Echigo Pte Ltd, Singapore (SG)

( * ) Notice: Subject to any disclaimer, the term of this patent is extended or adjusted under 35 U.S.C. 154(b) by 176 days.

(21) Appl. No.: 13/989,034

(22) PCT Filed: Nov. 23, 2011

(86) PCT No.: PCT/IB2011/002800
§ 371 (c)(1),
(2), (4) Date: May 22, 2013

(87) PCT Pub. No.: WO2012/069914
PCT Pub. Date: May 31, 2012

(65) Prior Publication Data
US 2013/0240003 A1    Sep. 19, 2013

(30) Foreign Application Priority Data
Nov. 23, 2010  (SG) ................. 201008672-6

(51) Int. Cl.
*B08B 3/06* (2006.01)
*B08B 3/04* (2006.01)
*H05K 3/26* (2006.01)

(52) U.S. Cl.
CPC . *B08B 3/06* (2013.01); *B08B 3/048* (2013.01); *H05K 3/26* (2013.01)

(58) Field of Classification Search
CPC .............. B08B 3/04; B08B 3/06; B08B 3/12; B08B 3/14; F16K 3/34; F26B 21/006; F26B 21/04; H01J 37/3244; Y10S 134/902; Y10S 438/905
USPC .......... 134/182, 186, 902; 239/193, 390, 436, 239/461, 589
See application file for complete search history.

(56) References Cited

U.S. PATENT DOCUMENTS

| 4,207,647 A * | 6/1980 | Masters ..................... 15/302 |
| 5,836,325 A * | 11/1998 | Akanuma et al. ............. 134/183 |
| 6,539,963 B1 | 4/2003 | Dunn |
| 6,625,835 B1 | 9/2003 | Frost et al. |
| 2007/0227563 A1 | 10/2007 | Yamamoto et al. |

FOREIGN PATENT DOCUMENTS

| CN | 101108388 A | 1/2008 |
| CN | 101738030 B | 3/2014 |
| JP | 2007229595 A | 9/2007 |

OTHER PUBLICATIONS

Australian Patent Office; International Search Report; Mar. 26, 2012; Woden Act, Australia 2606.

* cited by examiner

*Primary Examiner* — Michael Kornakov
*Assistant Examiner* — Tinsae Ayalew
(74) *Attorney, Agent, or Firm* — Michael J. Donohue; Davis Wright Tremaine LLP

(57) ABSTRACT

A cleaning system comprising a tank having a wash area arranged to receive an article for cleaning; an inlet assembly mounted to a first end of the tank, through which a cleaning medium flows into the wash area; an outlet assembly having a flow control plate mounted to a second end of the tank; the flow control plate having a plurality of apertures and arranged such that the cleaning medium flows from the wash area through the apertures; the flow control plate arranged such that a total outlet area of the tank is equal to a sum of areas of the apertures; wherein the proportion of the total outlet area about the flow control plate is inversely proportional to a depth of the tank.

13 Claims, 6 Drawing Sheets

FLOW TANK

FIELD OF THE INVENTION

The invention relates to the cleaning of high precision articles such as hard disc drives in order to remove detritus prior to assembly. In particular, the invention relates to the removal of such particles through cleaning and rinsing.

BACKGROUND

Prior to the assembly of a hard disc drive it is necessary for the disc to be cleaned so as to prevent unnecessary damage and increase the longevity of the assembled device.

On completion of the cleaning process, the disc must be rinsed so as to remove any stray particles that may have adhered to the disc.

Given the high volume of discs to be cleaned and rinsed during the manufacturing process, the cleaning and rinsing steps are performed in continuous or batch process lots and so pass through phase flow tanks prior to final assembly. As a result, the rinsing medium, such as water, will retain in suspension particles from previous batches within the phase flow tank. It is therefore necessary for the phase flow tank to have a continual replacement of the rinsing medium in order to remove the suspended particles and so avoid cross contamination with subsequent batches.

It has been found that for phase flow tanks, whilst removing a substantial proportion of the particles in suspension, there tends to be "dead zones" within the tank through eddies and other features of discontinuous turbulent flow leading to the retention of particles within the phase flow tank.

It is therefore necessary to frequently change the rinsing medium within the phase flow tank to avoid cross contamination. This can result in significant wastage of the rinsing medium as well as lost capacity in having the phase flow tank taken offline during replacement of the rinsing medium.

SUMMARY OF INVENTION

In a first aspect the invention provides a cleaning system comprising a tank having a wash area arranged to receive an article for cleaning; an inlet assembly mounted to a first end of the tank, through which a cleaning medium flows into the wash area; an outlet assembly having a flow control plate mounted to a second end of the tank; said flow control plate having a plurality of apertures and arranged such that the cleaning medium flows from the wash area through said apertures; said flow control plate arranged such that a total outlet area of said tank is equal to a sum of areas of the apertures; wherein the proportion of the total outlet area about the flow control plate is inversely proportional to a depth of said tank.

By introducing a flow control plate arranged with an array of apertures so as to yield a controlled outlet flow, the flow within the tank can be controlled and "dead zones" or eddies avoided. With the area through which the cleaning medium flows through the flow control plate unevenly distributed about the plate, and more particularly inversely proportional to depth, it is possible to make the flow rate independent of depth. For instance, having most of the aperture area concentrated near the top of the plate, where the pressure head is least, and less at the bottom where the pressure head is more, a more uniform distribution of outlet flow is possible. Further, it may be possible to achieve laminar flow within the wash are of the tank and so avoid the difficulties associated with turbulent flow.

In a further embodiment the flow control plate may be calibrated to provide a particular flow at discreet depths of the rinsing medium within the tank. For instance, the flow at a particular depth may be arranged to be within a certain tolerance of a desired flow rate. Further, the outlet plate may be arranged to provide uniform flow at each depth so as to provide a consistent flow rate within the tank independent of the depth.

It will be appreciated that if the flow rate is relatively uniform, independent of depth, then turbulence may be minimized and possibly laminar flow may result.

In a further embodiment, the flow control plate may be manufactured such that the diameter of the outlet holes varies with depth. Alternatively, the number of holes within a row may vary with depth. Further, the number of rows of holes within the flow control plate may provide incremental change in the flow rate of each hole and arranged so as to provide the uniform flow rate.

More specifically, the proportion of the total outlet area is a function of a flow rate at a specific depth of the flow control plate. To this end, the apertures may be arranged in predetermined number of horizontal rows at discreet depths along the flow control plate. Further, the cumulative flow rate of each row is within ±10 to 20% of an average cumulative flow rate.

In a further embodiment, the flow control plate may include a weir so as to maintain a maximum depth of the cleaning medium.

The inlet assembly may include a diffusion assembly, where the diffusion assembly may have at least one flow conditioning plate, such that the flow conditioning plate has an array of apertures through which the cleaning medium flows. Alternatively, the inlet assembly may include a plurality of flow conditioning plates each having an array of apertures through which the cleaning medium flows, said flow conditioning plates separated so as to provide a void between adjacent plates.

The outlet assembly may include an outlet box for collecting the cleaning medium on flowing through the flow control plate, with the outlet box positioned lower than the tank, said outlet assembly including an air gap between the outlet box and flow control plate to ensure gravity flow of said cleaning medium.

In another embodiment, the inlet assembly may include an inlet chamber upstream from the flow conditioning plate. Further, there may be an inflow at a base of said inlet chamber, such that the inlet chamber receives the cleaning medium from the inflow prior to the cleaning medium exiting the inlet chamber through the flow conditioning plate.

As mentioned, in order to achieve the desired distribution of the total aperture area, the number of apertures in each row may be the same, with the area of each aperture varying between at least some of the rows. Alternatively, the area of each aperture may be the same, and the number of apertures varying between at least a portion of the rows.

BRIEF DESCRIPTION OF DRAWINGS

It will be convenient to further describe the present invention with respect to the accompanying drawings that illustrate possible arrangements of the invention. Other arrangements of the invention are possible and consequently, the particularity of the accompanying drawings is not to be understood as superseding the generality of the preceding description of the invention.

DETAILED DESCRIPTION

For low-viscosity incompressible fluids such as water, the incompressible Bernoulli equation describes the flow. Applying this equation to a "streamline" that starts at the top free surface and exits out the spout yields, $\rho g z_{surface} + p_{atm} = \frac{1}{2}\rho V_{jet}^2 + \rho g z_{spout} + p_{atm}$ s the same pressure as the free surface (patm). Solving for the fluid jet velocity gives, $$V_{jet} = \sqrt{2g(z_{surface} - z_{spout})} = \sqrt{2g\Delta z}$$

The non-zero viscosity of fluids will rob the flow of mechanical energy (converting it into heat within boundary layers hugging the spout walls), hence the fluid jet beyond the spout exit will have a slightly smaller diameter than that of the spout. This factor can be accounted for by a discharge coefficient C, whose value is typically between 0.90 and 0.98. The volumetric flow rate Q results from multiplying the jet velocity times the cross-sectional area, $$Q = A_{jet}V_{jet} = CA_{spout}V_{jet}$$

Figures 1A, 1B:
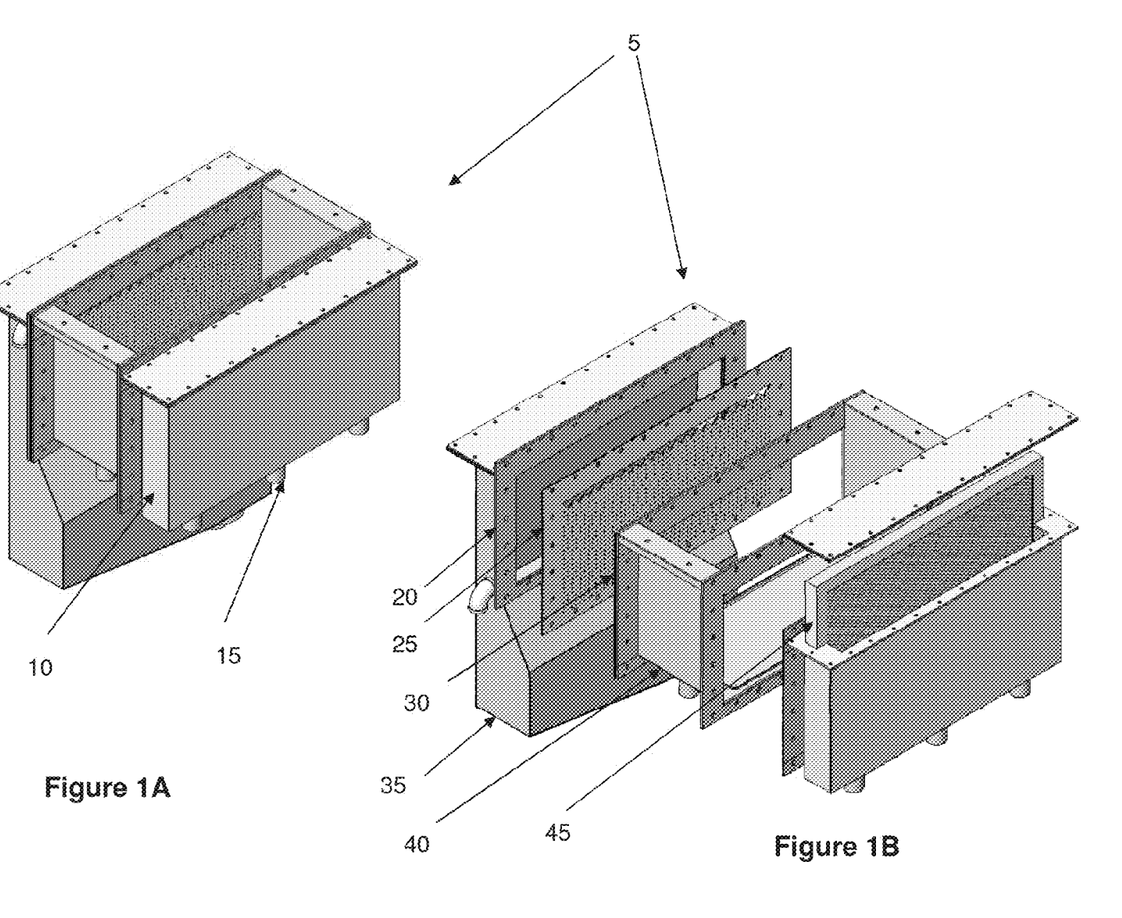
FIGS. 1A and 1B are isometric and exploded isometric views of a phase flow tank according to one embodiment of the present invention.

FIGS. 1A and 1B show a cleaning system, comprising a phase flow tank 5 according to one embodiment of the present invention. The tank 5 comprises an inlet assembly 10, a wash area 40 and an outlet assembly 20. The articles to be cleaned and/or rinsed are placed within the wash area 40 with an inflow of a cleaning medium entering the inlet assembly 10 passing through the wash area 40 and cleaning or rinsing the article to remove particles before flowing through the outlet assembly 20 with the particles in suspension and entering the outlet box 35.

It will be appreciated that the cleaning system may be used for either cleaning rinsing or both. To this end, the expression "cleaning system" refers to the use of the same invention for either rinsing or cleaning. Further, "cleaning medium" and "rinsing medium" will be used interchangeably and is not intended to limit the invention, but merely show the same invention is applicable to both processes. Further still, as water is a common medium for either process, this will also be used interchangeably without affecting the scope of the invention.

A key component of the phase flow tank 5 according to the present invention is the use of a flow control plate 25 which is arranged in order to control the flow of water through the outlet assembly 20 independent of the depth of water. Thus, the flow rate of water exiting the flow control plate 25 at the base is approximately equal to that of the flow rate adjacent to the top. In this way, a more uniform flow rate is maintained in the wash area 40 which may prevent the formation of "dead zones" and eddies within the tank and so maximizing the removal of particles by the rinsing medium flowing through the wash area. In practice, it may not be possible to precisely match the flow rate for each row, as the use of varying numbers of rows, numbers of apertures or aperture area will represent a step function between the rows. To this end, a tolerance of 10 to 20% may still be acceptable in achieving the uniform flow within the scope of the present invention.

FIG. 1B further shows a diffusion assembly 45 used to control the flow of water entering the tank through a series of flow conditioning plates. Thus, ensuring water entering the wash area 40 is uniform with minimum turbulence.

Further still, by providing an outlet box 35 in communication as part of the outlet assembly 20, the water flowing through the flow control plate 25 is subject to gravity flow and therefore non-pressure. By avoiding a pressurized flow, turbulent flow within the wash area 40 caused by the applied pressure is removed.

Figures 2A, 2B, 2C:
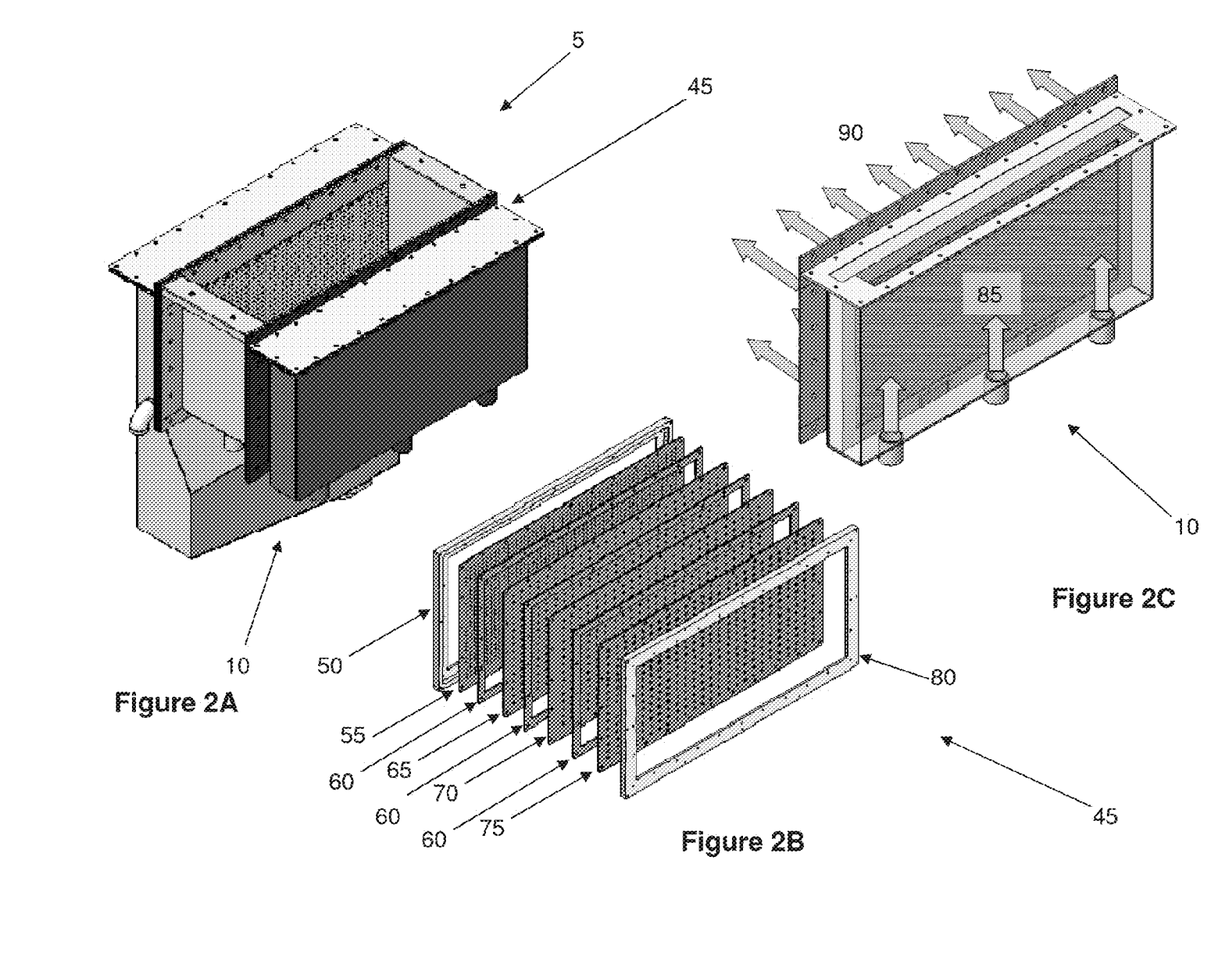
FIGS. 2A, 2B and 2C are various isometric views of a diffuser assembly according to a further embodiment of the present invention.

FIGS. 2A to 2C show a further embodiment of the present invention. The inlet assembly 10 includes a diffuser plate assembly 45 having at least one flow conditioning plate, in this case there are four such plates. As mentioned, the diffuser plate assembly 45 acts to "even out" the flow through passing the inlet water through a series of the flow conditioning plates 55, 65, 70, 75. Any turbulence within the inlet flow 85 is removed by passing the water through apertures in each plate. Each plate includes an array of holes distributed about the "flow face" of the plate. That is, the flow face being that portion of the plate which is exposed to the flow of the rinsing medium. By providing a distribution of holes or apertures in the plate, "dead zones" are avoided by extending the holes to the peripheral edge of the flow face. It will be appreciated that each of the plates 55, 65, 70, 75 may be identical. Alternatively, the diameter of the apertures may decrease with each plate progressively downstream. For instance, the first plate 75 may have large apertures which are progressively smaller in the next plate 70 and progressively smaller in the third plate 65 until the final plate 55 has apertures of a small diameter. In a further embodiment, in the case of the diameter of the apertures decreasing, the concentration of holes may increase such that the total porosity of each plate is identical being the sum of the aperture areas for each plate. In a further embodiment, the hydraulic porosity may be the same for each plate, that is, the sum of the aperture areas taking hydraulic losses into account are the same. It will be appreciated that the smaller the holes/apertures, the higher the effective hydraulic loss will be for the same total aperture area. These hydraulic losses may be accommodated by increasing the number of apertures such that the total aperture area for each plate may vary but the flow rate through each plate may be the same taking such hydraulic losses into account.

The diffusion assembly 45 includes gaskets 60 separating each plate such that the flow of water includes a small void in between each plate. The assembly is held together between two frames 50, 80 so as to form a unitary member when assembled. Assembly may further include screws or other fixtures so as to stay together for assembly of the phase flow tank 5.

FIG. 2C shows the flow path within the inlet assembly 10. In this case, the inlet assembly 10 includes an inlet chamber into which water flows 85 through an inflow in the base of the inlet chamber consequently filling the chamber. The rate of flow 85 may be gauged so as to maintain a full depth within the chamber whilst inlet flow 90 into the tank is maintained. Thus, the volume of water within the chamber acts as a ready supply of water into the tank.

In this embodiment, three inlet ports, acting as the inflow, in the base of the chamber permit water to flow 85 into the chamber. In this embodiment, it is desired to allow sufficient water to flow through freely into the chamber to maintain the source of water into the tank but not having the inlet flow so high as to create significant turbulence within the chamber. Thus, whilst a single inlet to the chamber may be possible, three provide advantage in reducing turbulence. It would be appreciated that more inlet ports may be used to further reduce turbulence.

The effect of the diffusion assembly 45 provides a regulated flow 90 into the tank. It would be appreciated that the diffusion assembly 45 may include plates which are arranged to provide a uniform flow rate independent of depth.

Figures 3A, 3B:
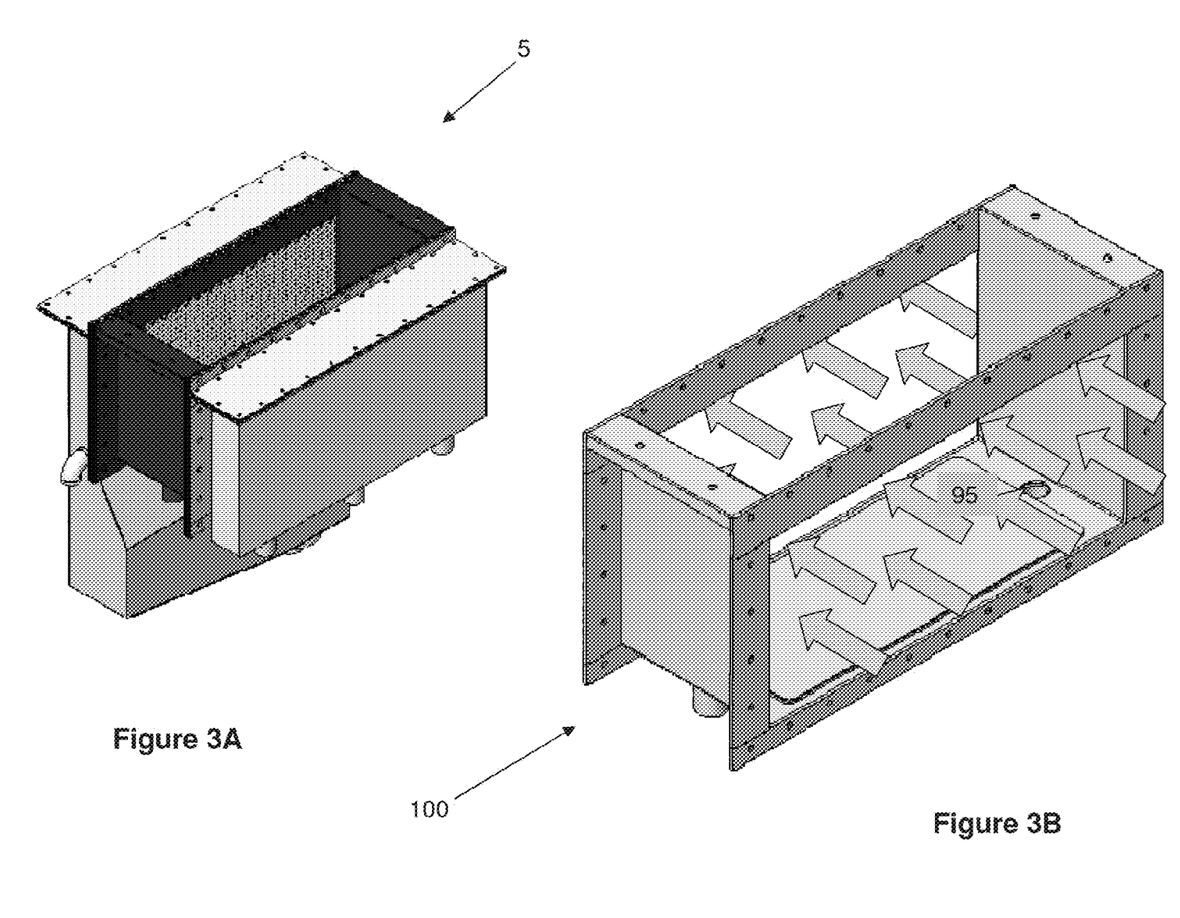
FIGS. 3A and 3B are isometric views of the flow path of the phase flow tank according to a further embodiment of the present invention.

FIGS. 3A and 3B show the phase flow tank 5 and the desired result of a regulated flow 95 through the wash area 100. The desire is to include a full flow throughout the wash area so as to avoid "dead zones" at the corners of the wash area, for instance, where particles may build up. In a further embodiment, the flow 95 may be sufficiently regulated by the diffuser assembly or by the flow control plate or by the gravity flow as the water drains from the wash area or any combination of these three, to achieve laminar flow within the wash area. It is desirable to at least have very low turbulence within the wash area if laminar flow is not achievable for certain applications of the phase flow tank according to the present invention.

Figure 4A:
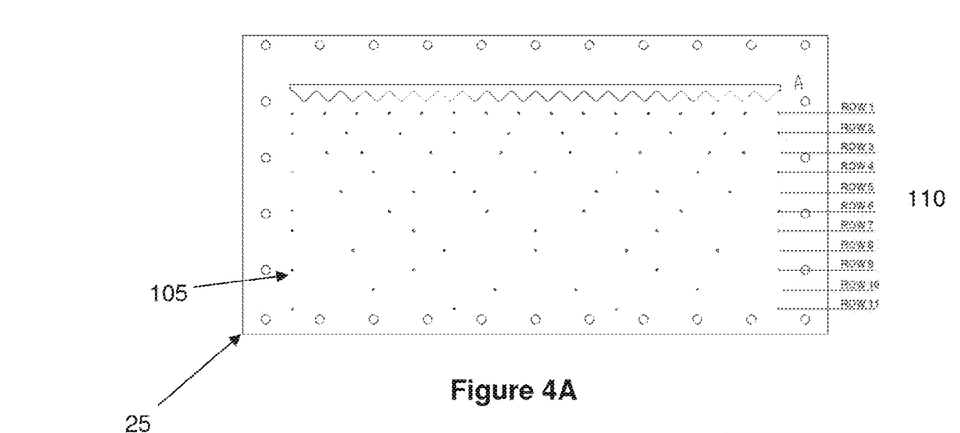
FIG. 4 is an elevation view of a flow control plate according to a further embodiment of the present invention.
Figure 4B:
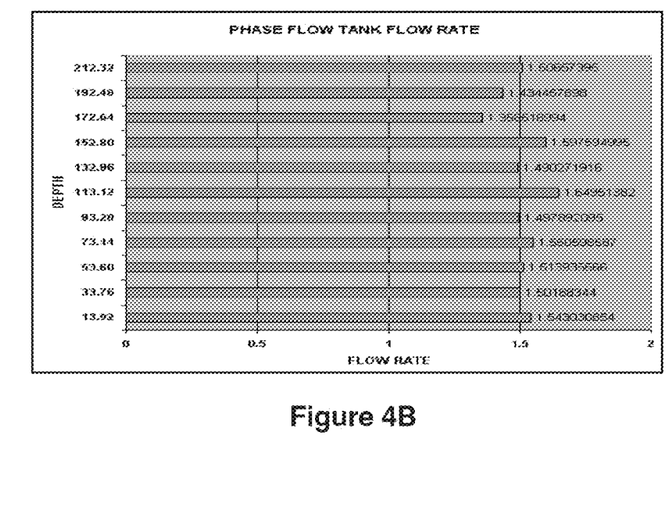

FIG. 4A shows the flow control plate 25 acting as a barrier to the flow before entering the outlet assembly, having a weir at the top of the plate to ensure the rinsing medium level within the wash area does not exceed a maximum depth. The flow control plate includes aperture 105 which are arranged in a series of rows 110. It will be appreciated that the distribution of apertures within the flow control plate 25 is arranged to achieve as uniform flow, independent of depth, as possible. FIG. 4B shows the effect of apertures having an area of 3.14 square millimeters with each row separated by 19.84 millimeters.

TABLE 1

Flow Rate Results

| ROW NO. | DEPTH (mm) | FLOW RATE OF ONE SPOT (L/S) | FLOW RATE OF ONE SPOT (L/MIN) | TOTAL NO. OF SPOUT | FLOW RATE OF ONE ROW (L/MIN) |
|---|---|---|---|---|---|
| 1 | 13.92 | 0.0016073 | 0.096439428 | 16 | 1.543030854 |
| 2 | 33.76 | 0.0025031 | 0.150188344 | 10 | 1.50188344 |
| 3 | 53.60 | 0.0031540 | 0.189241946 | 8 | 1.513935566 |
| 4 | 73.44 | 0.0036919 | 0.221514084 | 7 | 1.550598587 |
| 5 | 93.28 | 0.0041608 | 0.249648683 | 6 | 1.497892095 |
| 6 | 113.12 | 0.0045820 | 0.27491897 | 6 | 1.64951382 |
| 7 | 132.96 | 0.0049676 | 0.298054383 | 5 | 1.490271916 |
| 8 | 152.80 | 0.0053253 | 0.319518999 | 5 | 1.597594995 |
| 9 | 172.64 | 0.0056605 | 0.339629748 | 4 | 1.358518994 |
| 10 | 192.48 | 0.0059769 | 0.358614475 | 4 | 1.434457898 |
| 11 | 212.32 | 0.0062774 | 0.376643488 | 4 | 1.50657395 |
| | | | TOAL FLOW RATE (L/MIN): | | 16.64427212 |

Table 1 provides the data for the arrangement of the flow control plate 25 according to an experiment conducted in a phase flow tank. As shown in FIG. 4B, the flow is relatively uniform independent of depth and so falling within the present invention, and in fact, the flow rate for each row falls with ±10% of the average flow being the total flow through the flow control plate, divided by the number of rows (16.644 l/min/11 rows=1.513 l/min). It will be appreciated that beneficial results will also occur when the tolerance of row flow rate to average row flow rate is within ±20%.

It will be appreciated that the reduction in depth pitch between the rows or increasing the number of apertures may more finely tune the flow control plate 25 to reduce the variation in flow between each row.

Figure 5A:
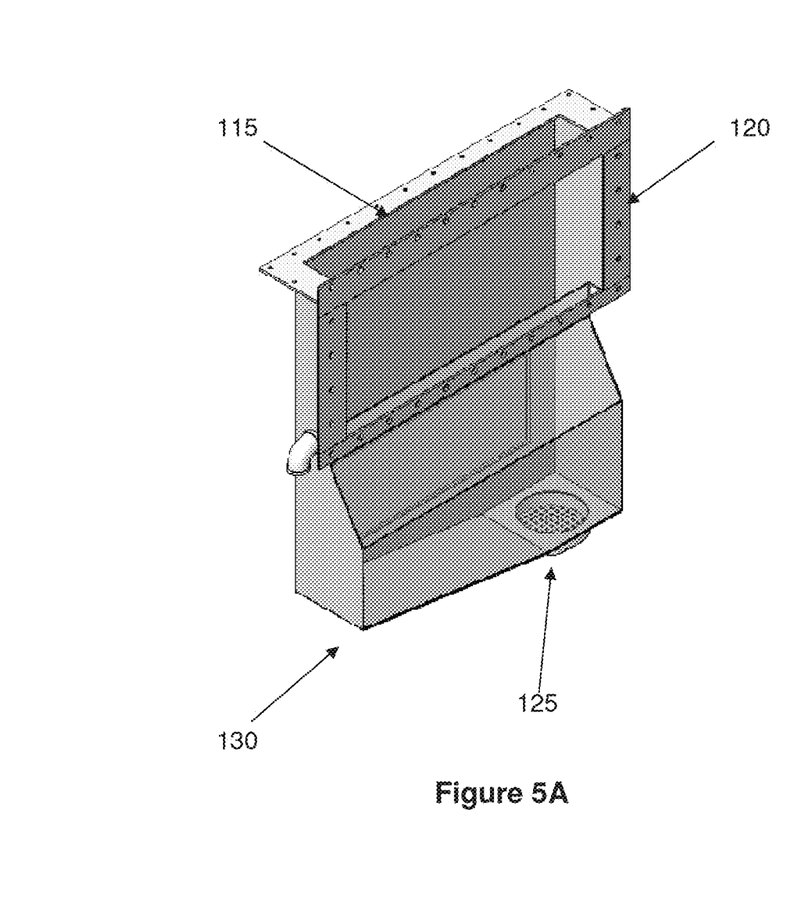
FIGS. 5A and 5B are various views of an outlet box according to a further embodiment of the present invention.
Figure 5B:
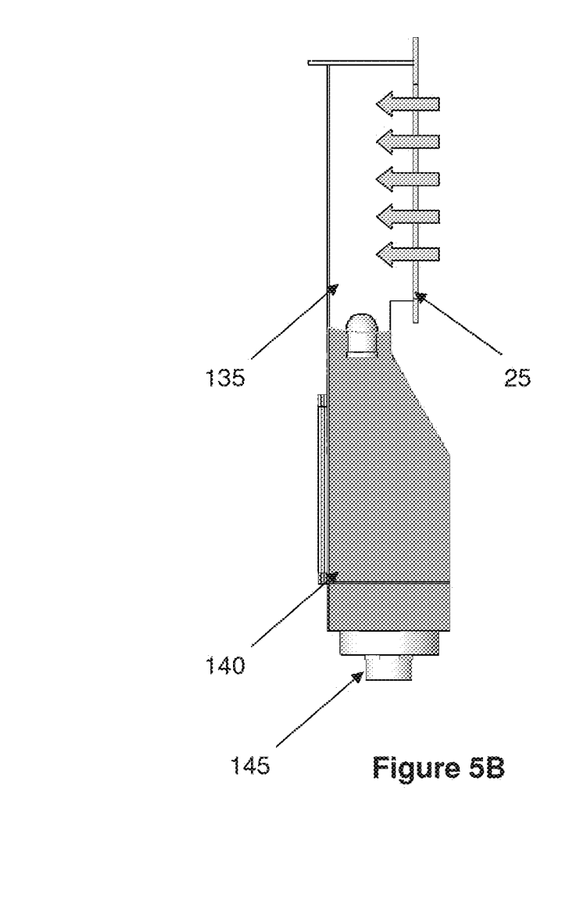

FIGS. 5A and 5B show the outlet assembly 115 comprising a chamber 135 into which the rinsing medium flows through the flow control plate 25. The flow control plate 25 is mounted to a flange 120 of the outlet assembly 115. The outlet assembly further includes an outlet box 130 which collects the rinsing medium 140 at a point below the wash area. The outlet assembly 115 further includes an overflow point as well as a drain 145 for removing the rinsing medium 140 from outlet box 130. Thus, the outlet assembly while providing a gravity flow system and further having the rinsing medium collection point below the wash area effectively provides a gap 135 between the flow control plate 25 and the collected rinsing medium 140. With a container area, the outlet box can contain almost 100% capacity of washing tank; so that a pump can be connected to the bottom drain of outlet box to pump out water and deliver it back to inlet box to perform recirculation in the system. This air gap therefore prevents the chance of a siphon effect occurring and so creating a pressurized environment.

Figure 6:
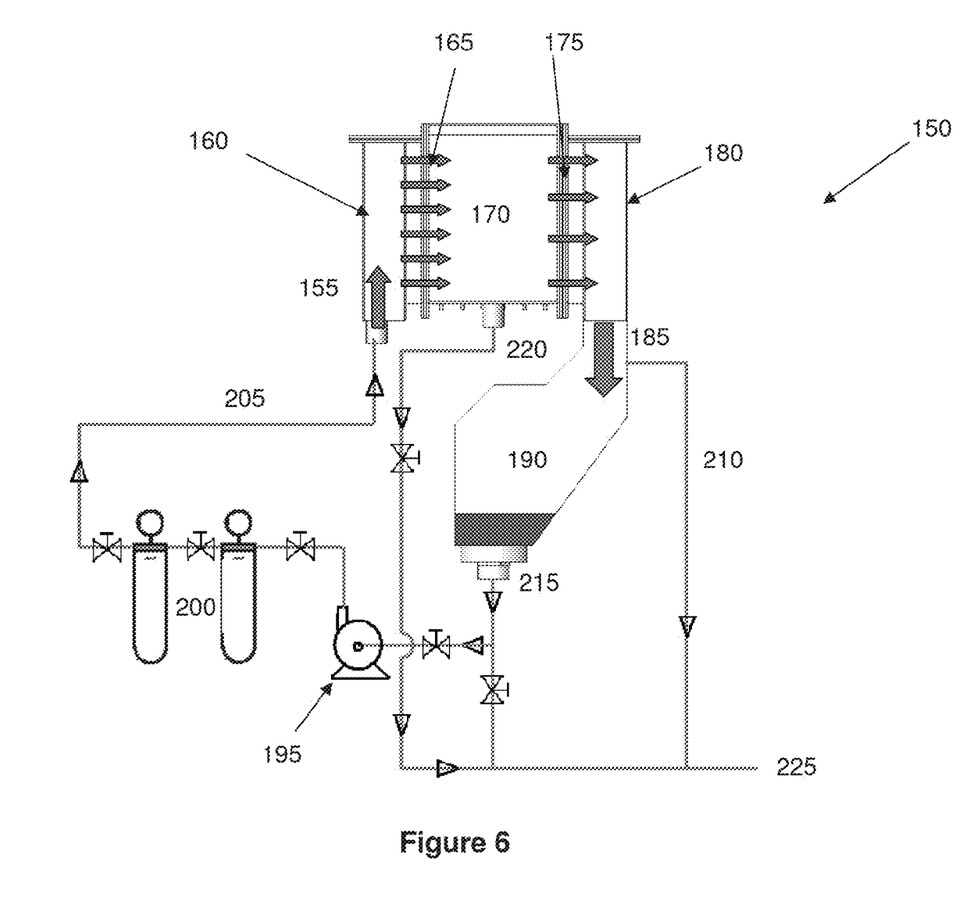
FIG. 6 is a schematic view of a phase flow tank system according to a further embodiment of the present invention.

FIG. 6 shows a schematic view of the system 150 for the phase flow tank. Here the inlet chamber 160 receives an upward flow 155 of the rinsing medium. Turbulence within the rinsing medium is reduced through passing of the rinsing medium through the diffuser assembly 165 into the wash area 170. The flow from the wash area 170 then passes through the flow control plate 175 into the outlet chamber 180 and subsequently drops into the outlet box 190. An overflow drain 185 ensures the outlet chamber 180 remains empty through draining excess rinsing medium through the overflow pipe 210 to an eventual drain 225. The outlet box 190 further includes a drain 215 for recycling the rinsing medium by pump 195 which passes the rinsing medium through filters 200 before recycling 205 the rinsing medium into the inlet chamber 160.

Eventually the recycled rinsing medium will need to be replaced and so the wash area 170 further includes a drain 220 for disposing of the rinsing material.

The invention claimed is:

1. A cleaning system comprising
a tank having a wash area arranged to receive an article for cleaning;
an inlet assembly mounted to a first end of the tank, through which a cleaning medium flows into the wash area;
an outlet assembly having a flow control plate mounted to a second end of the tank;
said flow control plate having a plurality of apertures and arranged such that the cleaning medium flows from the wash area through said apertures;
said flow control plate arranged such that a total outlet area of said tank is equal to a sum of areas of the apertures;
the proportion of the total outlet area about the flow control plate is inversely proportional to a depth of said tank,
wherein the outlet assembly includes an outlet box for collecting the cleaning medium on flowing through the flow control plate, said outlet box positioned lower than the tank, said outlet assembly including an air gap between the outlet box and flow control plate to ensure gravity flow of said cleaning medium.

2. The cleaning system according to claim 1, wherein the proportion of the total outlet area is a function of a flow rate at a specific depth of the flow control plate.

3. The cleaning system according to claim 1, wherein the apertures are arranged in pre-determined number of horizontal rows at discreet depths along the flow control plate.

4. The cleaning system according to claim 3, wherein the cumulative flow rate of each row is within ±20% of an average cumulative flow rate.

5. The cleaning system according to claim 4, wherein the cumulative flow rate of each row is within ±10% of an average cumulative flow rate.

6. The cleaning system according to claim 1, wherein the flow control plate includes a weir so as to maintain a maximum depth of the cleaning medium.

7. The cleaning system according to claim 1, wherein the inlet assembly includes at least one flow conditioning plate, said flow conditioning plate having an array of apertures through which the cleaning medium flows.

8. The cleaning system according to claim 7, wherein the inlet assembly includes a plurality of flow conditioning plates each having an array of apertures through which the cleaning medium flows, said flow conditioning plates separated so as to provide a void between adjacent plates.

9. The cleaning system according to claim 7, wherein the inlet assembly includes an inlet chamber upstream from the at least one flow conditioning plate, and having an inflow at a base of said inlet chamber, such that the inlet chamber is arranged to receive the cleaning medium from the inflow prior to the cleaning medium exiting the inlet chamber through the at least one flow conditioning plate.

10. The cleaning system according to claim 3, wherein the number of apertures in each row is the same, and the area of each aperture varies between at least some of the rows.

11. The cleaning system according to claim 3, wherein the area of each aperture is the same, and the number of apertures varies between at least a portion of the rows.

12. The cleaning system according to claim 1, wherein the wash area is of prismatic shape with apertures in the inlet and outlet assemblies distributed through a cross-section of the wash area.

13. The cleaning system according to claim 6, wherein the inlet assembly includes at least one flow conditioning plate, said flow conditioning plate having an array of apertures through which the cleaning medium flows.

\* \* \* \* \*